(12) United States Patent
Tanida

(10) Patent No.: US 7,506,421 B2
(45) Date of Patent: Mar. 24, 2009

(54) IN-VEHICLE IMAGE MODULE WITH AREAS OF DIFFERENT RESOLUTION

(75) Inventor: Katsunori Tanida, Kariya (JP)

(73) Assignee: DENSO CORPORATION, Kariya (JP)

( * ) Notice: Subject to any disclaimer, the term of this patent is extended or adjusted under 35 U.S.C. 154(b) by 38 days.

(21) Appl. No.: 11/358,086

(22) Filed: Feb. 22, 2006

(65) Prior Publication Data

US 2006/0243882 A1 Nov. 2, 2006

(30) Foreign Application Priority Data

Apr. 27, 2005 (JP) ............................. 2005-130381

(51) Int. Cl.
*H01L 27/00* (2006.01)
(52) U.S. Cl. .............. 250/208.1; 250/208.6; 250/214.1; 348/218.1; 348/113; 348/118; 348/275; 348/148
(58) Field of Classification Search .............. 348/218.1, 348/113, 118, 275, 148, 149, 222.1, 264; 250/208.1, 208.6, 214.1
See application file for complete search history.

(56) References Cited

U.S. PATENT DOCUMENTS 5,438,414 A * 8/1995 Rust ........................... 356/364
5,837,994 A * 11/1998 Stam et al. ................ 250/208.1
6,320,618 B1 * 11/2001 Aoyama ..................... 348/335
6,455,831 B1 * 9/2002 Bandera et al. ........... 250/208.1
6,563,101 B1 * 5/2003 Tullis ....................... 250/208.1
6,617,564 B2 * 9/2003 Ockerse et al. ........... 250/208.1
2005/0041123 A1 * 2/2005 Ansari et al. ................ 348/264
2005/0109918 A1 * 5/2005 Nikzad et al. ............. 250/208.1

FOREIGN PATENT DOCUMENTS

JP A-6-086183 3/1994
JP A-6-197288 7/1994

* cited by examiner

Primary Examiner—Seung C Sohn
(74) Attorney, Agent, or Firm—Posz Law Group, PLC

(57) ABSTRACT

An in-vehicle image module for imaging a light image of an outside of an automotive vehicle includes: an imager having multiple image elements, which are disposed to be a square lattice pattern; an optical system for focusing the light image on the imager. The imager includes an upper imager and a lower imager in a direction of gravitational force. The imager has a convex shape. The upper imager is disposed on an upper side of the convex shape of the imager in the direction of gravitational force. The lower imager is disposed on a lower side of the convex shape of the imager in the direction of gravitational force. The upper imager has a number of the image elements per unit area, which is larger than a number of the image elements per unit area in the lower imager.

20 Claims, 4 Drawing Sheets

IN-VEHICLE IMAGE MODULE WITH AREAS OF DIFFERENT RESOLUTION

CROSS REFERENCE TO RELATED APPLICATION

This application is based on Japanese Patent Application No. 2005-130381 filed on Apr. 27, 2005, the disclosure of which is incorporated herein by reference.

FIELD OF THE INVENTION

The present invention relates to an in-vehicle image module.

BACKGROUND OF THE INVENTION

An in-vehicle image module is mounted on an automotive vehicle, and detects another vehicle near the vehicle, illumination intensity of the outside of the vehicle and the like. Conventionally, an in-vehicle image module includes multiple image elements as a unit having the same sensitivity, which are arranged to be in a square lattice pattern.

In the conventional module, another vehicle around a vehicle having the module is completely captured by image elements in the module having a sufficiently large number. Specifically, the whole outline of the other vehicle is completely captured. Accordingly, when a light corresponding to a light image of the other vehicle disposed around the vehicle entered into a convex lens in the module from obliquely beneath along with a light path is detected, the light image can be captured with a sufficiently large image range, i.e., sufficiently wide view angle and with sufficiently high resolution. However, a background such as the Sun and a cloud around the vehicle is not completely captured. Further, a space among the Sun, the cloud and the other vehicle is captured by many image elements. Thus, when the light corresponding to illumination intensity around the vehicle entered into the convex lens from obliquely above along with a light path is detected, a sufficiently large image range, i.e., a sufficiently wide view angle is not secured. Further, a region such as the space among the Sun and the cloud, the region which is not required to have high resolution, is captured by many image elements. Accordingly, there is much waste of the image elements. Thus, the view angle is not sufficiently large so that the illumination intensity is hardly detected. Further, since the imager size is small, the dynamic range and the sensitivity are not sufficient so that the illumination intensity is hardly detected. Furthermore, a load for processing the image corresponding to the region not required to have high resolution becomes large, so that a processing time becomes longer.

SUMMARY OF THE INVENTION

In view of the above-described problem, it is an object of the present invention to provide an in-vehicle image module for imaging a light image of an outside of an automotive vehicle.

An in-vehicle image module for imaging a light image of an outside of an automotive vehicle includes an imager having multiple image elements, which are disposed to be a square lattice pattern; and an optical system for focusing the light image on the imager. The imager includes an upper imager and a lower imager in a direction of gravitational force. The imager has a protruding shape. The upper imager is disposed on an upper side of the protruding shape of the imager in the direction of gravitational force. The lower imager is disposed on a lower side of the protruding shape of the imager in the direction of gravitational force. The upper imager has a number of the image elements per unit area, which is larger than a number of the image elements per unit area in the lower imager.

In the above module, both of requirements for detecting another vehicle disposed near the vehicle and requirements for detecting illumination intensity of the outside of the vehicle are preferably satisfied.

Alternatively, an area of the upper imager may be smaller than an area of the lower imager so that each image element in the upper imager is smaller than that in the lower imager. Alternatively, the optical system may include a convex lens, and the convex lens has an optical center facing the upper imager so that the convex lens and the imager are shifted in the direction of gravitational force. Alternatively, the convex lens may have a shape, a part of which is missing, and the missing part of the shape of the convex lens faces the lower imager.

Further, an in-vehicle image module for imaging a light image of an outside of an automotive vehicle includes: an imager having multiple image elements, which are disposed to be a square lattice pattern; and an optical system for focusing the light image on the imager. The imager includes a plurality of parts in a direction of gravitational force. A part of the imager, which is disposed on an upper side of the imager in the direction of gravitational force, has a number of the image elements per unit area larger than a number of the image elements per unit area in another part of the imager, which is disposed on a lower side of the imager in the direction of gravitational force. The optical system includes a convex lens.

In the above module, both of requirements for detecting another vehicle disposed near the vehicle and requirements for detecting illumination intensity of the outside of the vehicle are preferably satisfied.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Figure 7A:
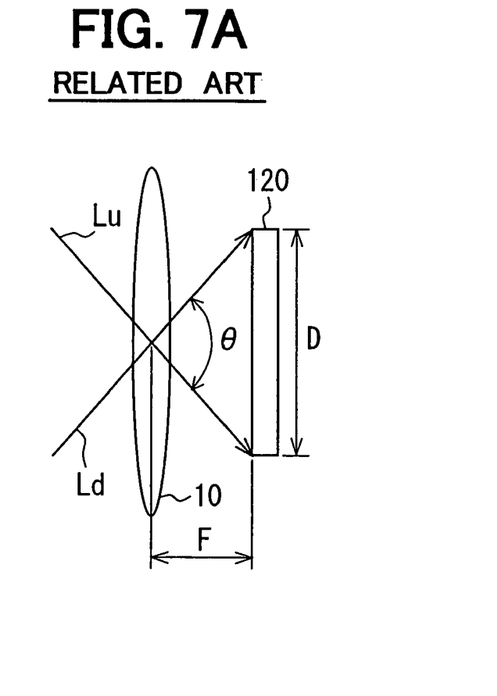
FIG. 7A is a side view showing an in-vehicle image module according to a comparison example of the first embodiment.
Figure 7B:
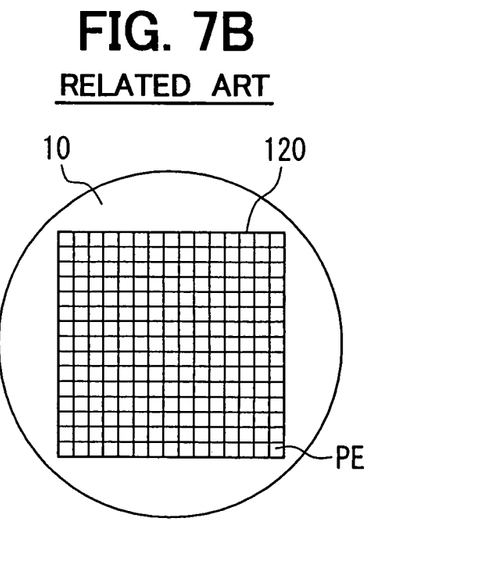
FIG. 7B is a front view showing the module shown in FIG. 7A.

An in-vehicle image module is mounted on an automotive vehicle, and detects another vehicle near the vehicle, illumination intensity of the outside of the vehicle and the like. The image module includes multiple image elements as a unit having the same sensitivity, which are arranged to be in a square lattice pattern. FIGS. 7A and 7B show the in-vehicle image module as a comparison example of a first embodiment of the present invention.

The image module includes a convex lens 10 and an imager 120. The convex lens 10 has a circular shape for condensing a light entered from a periphery of the vehicle and providing an image. The imager 120 has multiple image elements PE as a picture cell, which are arranged to be in a square lattice pattern. Each image element PE outputs an electric signal corresponding to the amount of light received by the image element PE, the light being entered from the convex lens 10. In FIG. 7B, the number of the image elements PE is 225 elements, which is obtained by multiplying 15 elements in width by 15 elements in height. Thus, the imager 120 includes 225 picture cells. Practically, the imager 120 includes, for example, a hundred thousand picture cells or three hundred thousands picture cells. In FIG. 7A, F represents a distance between the convex lens 10 and the imager 120, D represents an imager size, i.e., an imager dimension of the imager 120, and θ represents a view angle. The distance F and the imager size D are determined to set the view angle θ to be 50 degrees.

Figure 8A:
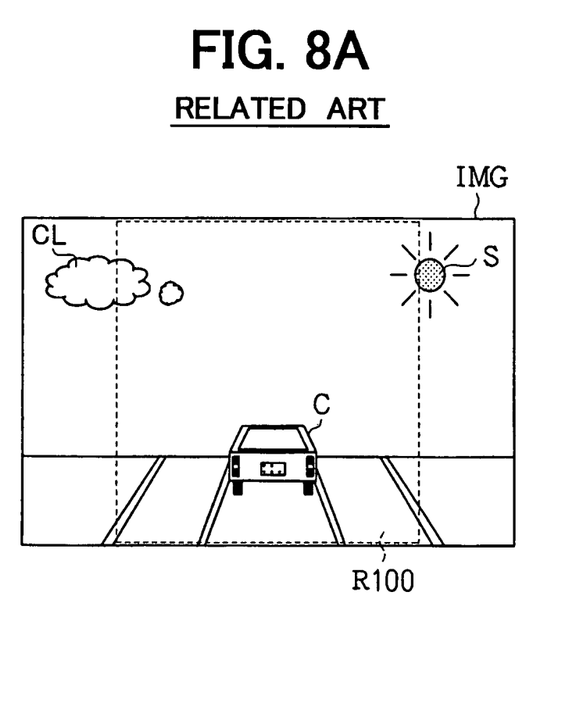
FIG. 8A is a landscape as an example of the object viewing from an automotive vehicle, according to the comparison example of the first embodiment.

When the image module detects another vehicle or the illumination intensity, a light corresponding to a light image of the other vehicle is entered into the convex lens 10 from obliquely beneath along with a light path Ld. A light corresponding to the illumination intensity around the vehicle is entered into the convex lens 10 from obliquely above along with a light path Lu. Each light along with the light path Ld and the path Lu produces an image on the imager 120. The image element PE on the imager 120 outputs an electric signal corresponding to a brightness of the produced image. The electric signal is inputted into an image processing circuit (not shown). The image processing circuit executes a predetermined process so that information of the image is obtained. Thus, for example, when the image module detects a landscape IMG shown in FIG. 8A, the image corresponding to an image area R100 shown as a dotted line in FIG. 8A is obtained as the image IMG100 in FIG. 8B. Here, actually, the landscape IMG is reversely formed to be the image on the imager 120 by the convex lens 10. However, for convenience, the image IMG100 is reversed again so that the image IMG100 consists with the landscape IMG. Specifically, although the left, right, top and bottom of the image on the imager 120 are reversed by the lens 10, the left, right, top and bottom of the image IMG 100 are reversed again so that the left, right, top and bottom of the image IMG 100 consists with those of the landscape IMG.

Figure 8B:
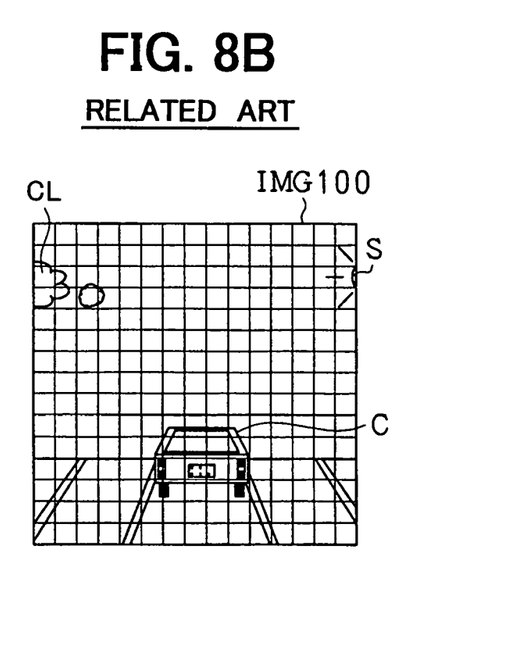
FIG. 8B is an image corresponding to the landscape around the vehicle captured by the module according to the comparison example of the first embodiment.

As shown in FIG. 8B, the other vehicle C is completely captured by the image elements PE having a sufficiently large number. Specifically, the whole outline of the vehicle C is completely captured. Accordingly, when the light Ld corresponding to the light image of the other vehicle C disposed around the vehicle entered into the convex lens 10 from obliquely beneath along with the light path Ld is detected, the light image can be captured with a sufficiently large image range, i.e., a sufficiently wide view angle and with sufficiently high resolution. However, a background such as the Sun S and the cloud CL is not completely captured. Further, a space among the Sun S, the cloud CL and the other vehicle C is captured by many image elements PE. Thus, when the light corresponding to the illumination intensity around the vehicle entered into the convex lens 10 from obliquely above along with the light path Lu is detected, a sufficiently large image range, i.e., a sufficiently wide view angle is not secured. Further, a region such as the space among the Sun S and the cloud CL, the region which is not required to have high resolution, is captured by many image elements PE. Accordingly, there is much waste of the image elements. Thus, the view angle is not sufficiently large so that the illumination intensity is hardly detected. Further, since the imager size is small, the dynamic range and the sensitivity are not sufficient so that the illumination intensity is hardly detected. Furthermore, a load for processing the image corresponding to the region not required to have high resolution becomes large, so that a processing time becomes longer.

Figure 1A:
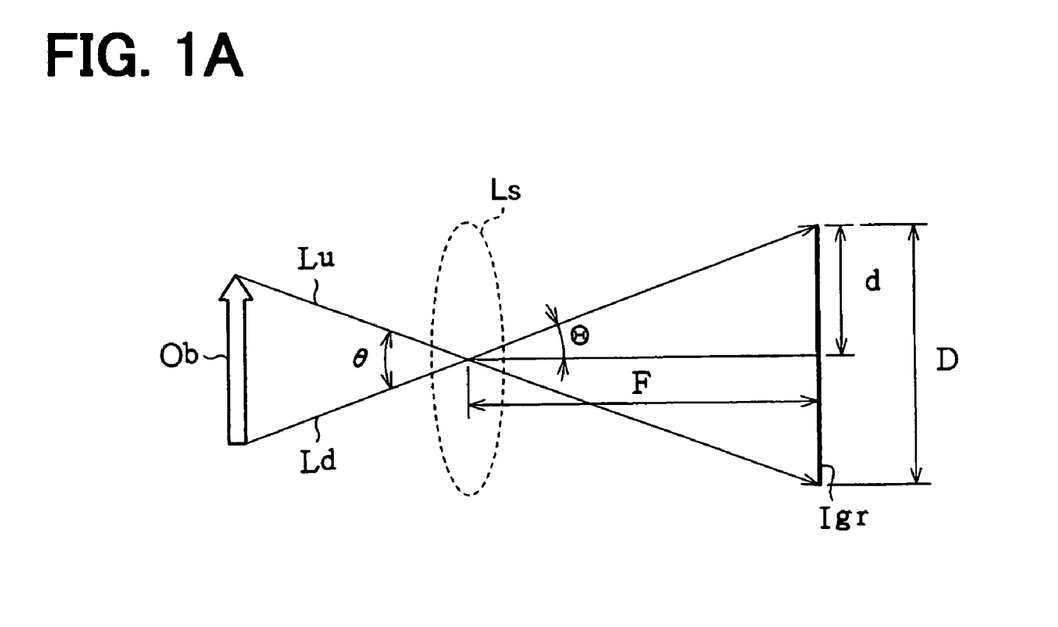
FIG. 1A is a schematic view explaining principle that a light image of an object is focused on an imager through a lens.
Figure 1B:
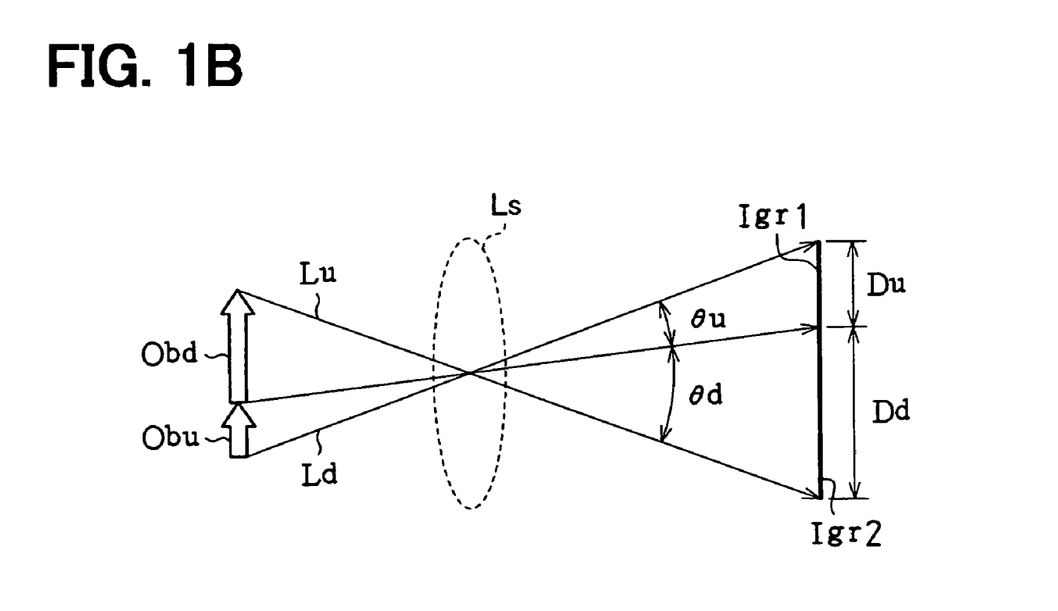
FIG. 1B is a schematic view explaining a relationship between a view angle and an imager size, according to a first embodiment of the present invention.

In view of the above problem, an aspect of the invention is explained with reference to FIGS. 1A and 1B. FIG. 1A shows a schematic view explaining a method for producing a light image of an object Ob of an image module on an imager Igr through a lens Ls. FIG. 1B shows a schematic view explaining a relation ship between an imager size and a view angle corresponding to the imager size.

As shown in FIG. 1A, a light from a top of the object Ob proceeds along with a light path Lu, and is reversed at a lens Ls so that the left, right, top and bottom of an image of the object Ob is reversed. The light from the top of the object Ob reaches the bottom of the imager Igr. A light from a bottom of the object Ob proceeds along with a light path Ld, and is reversed at a lens Ls so that the left, right, top and bottom of an image of the object Ob is reversed. The light from the bottom of the object Ob reaches the top of the imager Igr. Here, the top of the object Ob represents an upward in a direction of gravitational force, and the bottom of the object Ob represents a downward in the direction of gravitational force. In FIG. 1A, Θ represents a half view angle, d represents a half size of the imager size D of the imager Igr, and F represents a distance between the lens Ls and the imager Igr. The following relationship among the half view angle Θ, the half size d and the distance F is obtained.

$$\tan\Theta = \frac{d}{F} \quad \text{(Formula F1)}$$

Further, when θ represents a view angle, the view angle θ and the half view angle Θ have the following relationship.

$$\theta = \Theta \times 2 \quad \text{(Formula F2)}$$

Further, the imager size D and the half size d of the imager size have the following relationship.

$$D = d \times 2 \quad \text{(Formula F3)}$$

Accordingly, the view angle θ, the imager size D and the distance F have the following relationship.

$$\theta = \arctan\left(\frac{D}{2F}\right) \quad \text{(Formula F4)}$$

Thus, the view angle θ or the half view angle Θ is in inverse proportion to the distance F, and in proportion to the imager size D. When the distance F is constant, the view angle θ becomes larger as the imager size D becomes larger. Inversely, the view angle θ becomes smaller as the imager size D becomes smaller.

As shown in FIG. 1B, the imager Igr is divided into two parts, one of which is an upper region Igr1, and the other one of which is a lower region Igr2. Du represents the imager size of the upper region Igr1, which is disposed on upside of the imager Igr in the direction of gravitational force. Dd represents the imager size of the lower region Igr2, which is disposed on downside of the imager Igr in the direction of gravitational force. In this case, a view angle θu corresponds to the imager size Du of the upper region Igr1, and a view angle θd corresponds to the imager size Dd of the lower region Igr2. The upper region Igr1 corresponds to an object Obu, and the lower region Igr2 corresponds to an object Obd. Thus, the light image of the object Obu can be captured by the upper region Igr1, and the light image of the object Obd can be captured by the lower region Igr2. When the relationship between the imager sizes Du, Dd of the upper and the lower regions Igr1, Igr2 is Dd>Du, the relationship of the view angles θu, θd of view becomes θd>θu, and the relationship of the dimensions of the objects Obu, Obd becomes Obd>Obu. This is because the view angle θ is in proportion to the imager size D.

Accordingly, for example, the number of the image elements PE in the upper region Igr1 of the imager Irg is defined as Nu, and the number of the image elements PE in the lower region Igr2 of the imager Irg is defined as Nd. The number Nu in the upper region Igr1 is set to be larger than the number Nd in the lower region Igr2. Alternatively, the number Nu in the upper region Igr1 is set to be equal to the number Nd in the lower region Igr2. In these cases, the light image of the object Obu is captured by many image elements PE, i.e., the number of the image elements PE per unit area of the light image is large. Therefore, although the view angle θ u corresponding to the upper region Igr1 is narrow, the object Obu can be captured with high resolution. On the other hand, the light image of the object Obd is captured by a relatively small number of the elements PE, i.e., the number of the image elements PE per unit area of the light image is comparatively small. Therefore, although the resolution of the object Obd is low, the view angle θd corresponding to the lower region Igr2 is wide, the dynamic range is wide, and the sensitivity is high.

First Embodiment

An in-vehicle image module according to a first embodiment of the present invention is shown in FIGS. 2A to 4B. The module includes an imager 20 formed from multiple image elements PE. Each element PE is arranged to be a square lattice pattern. The imager 20 includes an upper imager 21a and a lower imager 21b. The upper imager 21a forms an upper portion of a protruding pattern in the direction of gravitational force, and the lower imager 21b forms a lower portion of the protruding pattern, so that the imager 20 provides the protruding pattern. The number of the image elements PE1 disposed in the upper imager 21a is equal to the number of the image elements PE2 disposed in the lower imager 21b. In this case, both of requirements for detecting another vehicle disposed near the vehicle and requirements for detecting illumination intensity of the outside of the vehicle are preferably satisfied.

Here, the requirements for detecting the other vehicle around the vehicle and the requirements for detecting the illumination intensity around the vehicle are as follows. In general, when the other vehicle around the vehicle is detected on the basis of the image information of the image obtained by the image module, it is required for the image information of the image with high resolution to perform a predetermined image processing such as outline recognition. The light image from the other vehicle corresponds to the light entered into the vehicle, i.e., the module from an obliquely beneath direction of the vehicle. This light is focused at an upper portion of the imager in the direction of gravitational force in such a manner that the left, right, top and bottom of the image on the imager are reversed by the optical system. Thus, the upper portion of the imager for capturing the light from the obliquely beneath direction may have small image area, i.e., small view angle. However, it is necessitated for the upper portion of the imager to have high resolution. Therefore, the requirements for detecting the other vehicle around the vehicle are at least high resolution.

On the other hand, when the illumination intensity around the vehicle is detected on the basis of the image information of the image obtained by the image module, it is required for the image information of the image with wide range, i.e., wide view angle, wide dynamic range and high sensitivity to obtain a sufficient brightness. The light image corresponding to the illumination intensity corresponds to the light entered into the vehicle, i.e., the module from an obliquely above direction of the vehicle. This light is focused at a lower portion of the imager in the direction of gravitational force in such a manner that the left, right, top and bottom of the image on the imager are reversed by the optical system. Thus, the lower portion of the imager for capturing the light from the obliquely above direction may have low resolution. However, it is necessitated for the lower portion of the imager to have wide view angle, wide dynamic range and high sensitivity. Therefore, the requirements for detecting the illumination intensity around the vehicle are at least wide view angle, wide dynamic range and high sensitivity.

Figure 2A:
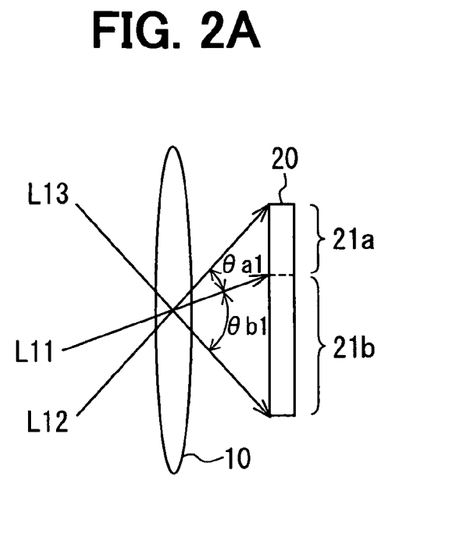
FIG. 2A is a side view showing an in-vehicle image module according to the first embodiment.
Figure 2B:
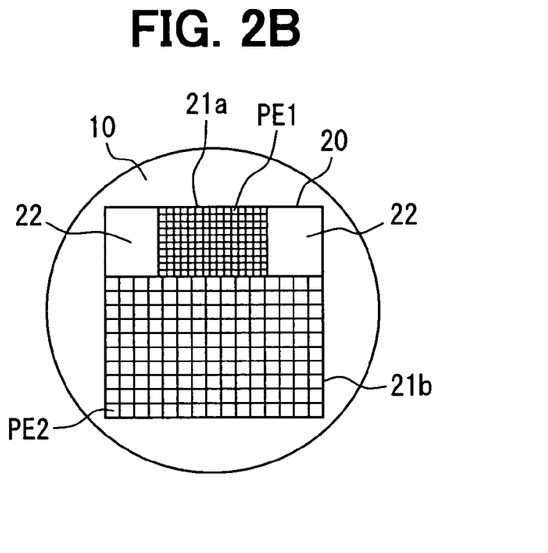
FIG. 2B is a front view showing the module shown in FIG. 2A.

The module includes one convex lens 10, the imager 20 and an image processing circuit 22. The convex lens 10 is disposed in an in-vehicle image device (not shown), which is mounted on the vehicle. The convex lens 10 forms a light image of the object on the imager 20. The object is a light image of the outside of the vehicle, and viewing from the vehicle. The imager 20 having multiple image elements PE is composed of the upper imager 21a and the lower imager 21b. The image processing circuit 22 processes the light image formed, i.e., focused on the imager 20. The image processing circuit 22 is disposed on a side of the upper imager 21a, so that the imager 20 further includes the image processing circuit 22.

The upper imager 21a is formed of 150 image elements PE1, i.e., 150 picture cells, which are obtained by multiplying 10 elements in height by 15 elements in width. Specifically, the image elements PE1 are arranged in 10 lines in the horizontal direction, and arranged in 15 lines in the vertical direction. Similarly, the lower imager 21b is formed of 150 image elements PE2, i.e., 150 picture cells, which are obtained by multiplying 10 elements in height by 15 elements in width. Specifically, the image elements PE2 are arranged in 10 lines in the horizontal direction, and arranged in 15 lines in the vertical direction. Thus, totally, 300 image elements PE provide the imager 20. Practically, the imager 20 includes, for example, a hundred thousand picture cells or three hundred thousands picture cells.

As shown in FIG. 2B, the number of the image elements PE1 per unit area of the upper imager 21a is larger than that of the lower imager 21b. Specifically, the image size, i.e., the dimensions of the image element PE1 arranged in the upper imager 21a is about a half of the image size of the image element PE2 in the lower imager 21b. Thus, the area of the image element PE1 in the upper imager 21a is about one-fourth of the area of the image element PE2 in the lower imager 21b. Accordingly, the light image to be focused on the upper region 21a is imaged with high resolution. The light image to be focused on the lower region 21b is imaged with wide dynamic range and high sensitivity. Here, the sensitivity of the image element PE1 in the upper imager 21a is the same as the image element PE2 in the lower imager 21b.

In the image module, when the other vehicle around the vehicle is detected, as shown in FIG. 2A, the light corresponding to the light image of the top of the other vehicle proceeds along with the light path L11, and the light reaches the bottom of the upper imager 21a in the imager 20. The light corresponding to the light image of the bottom of the other vehicle proceeds along with the light path L12, and the light reaches the top of the upper imager 21a in the imager 20. Thus, the light image corresponding to the other vehicle is focused on the upper imager 21a with a view angle of θa1.

When the illumination intensity around the vehicle is detected, as shown in FIG. 2A, the light corresponding to the illumination intensity of a near side of the vehicle proceeds along with the light path L11, and the light reaches the top of the lower imager 21b in the imager 20. The light corresponding to the illumination intensity of a far side of the vehicle proceeds along with the light path L13, and the light reaches the bottom of the lower imager 21b in the imager 20. Thus, the light image corresponding to the illumination intensity around the vehicle is focused on the lower imager 21b with a view angle of θb1.

Each of the image elements PE1, PE2 in the imager 20 outputs an electric signal corresponding to brightness of the light image focused on the image element PE1, PE2, and the electric signal is inputted into the image processing circuit 22. The image processing circuit 22 executes a predetermined image processing so that image information is obtained.

Thus, the light image corresponding to the other vehicle around the vehicle is focused on the upper imager 21a of the imager 20. In this case, although the view angle θa1 is small, the light image can be imaged with high resolution. The light image corresponding to the illumination intensity around the vehicle is focused on the lower imager 21b of the imager 20. In this case, although the resolution of the light image is low, the light image can be imaged with wide dynamic range, wide view angle θb1, and high sensitivity.

Figure 3:
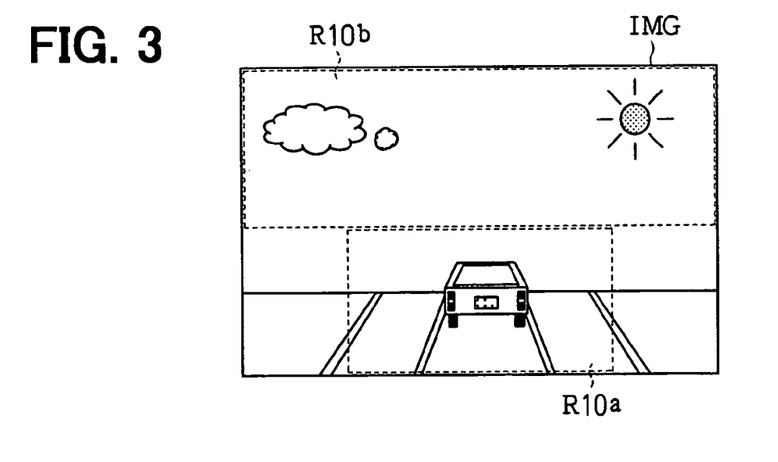
FIG. 3 is a landscape as an example of the object viewing from an automotive vehicle, according to the first embodiment.
Figure 4A:
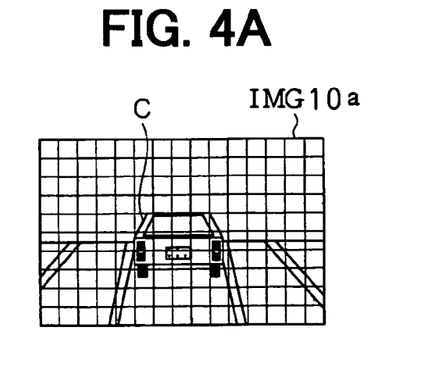
FIG. 4A is an image corresponding to another vehicle around the vehicle captured by the module.
Figure 4B:
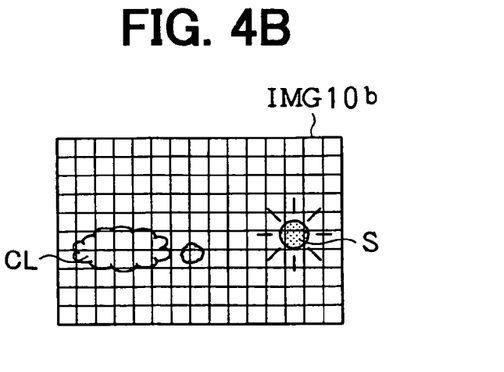
FIG. 4B is an image corresponding to illumination intensity around the vehicle captured by the module, according to the first embodiment.

FIG. 3 shows a landscape as an example of the object of the image module. FIG. 4A shows the image IMG10a focused on the upper imager 21a, and FIG. 4B shows the image IMG10b focused on the lower imager 21b. Here, although the landscape is imaged on the imager 20 in such a manner that the image of the landscape is reversed by the convex lens 10, i.e., although the left, right, top and bottom of the image on the imager 20 are reversed by the lens 10, the images IMG10a, IMG10b are reversed again in order to compare with the landscape IMG for convenience.

In general, when the other vehicle disposed around the vehicle is detected, the image information of the image is necessitated with sufficiently high resolution so that predetermined image analysis such as image recognition of outline of the other vehicle is performed. Specifically, it is preferred that the other vehicle disposed in front of the vehicle and in the center of the vehicle among other vehicles around the vehicle is imaged with high resolution. Specifically, a region R10a shown as a dotted line in FIG. 3, which corresponds to the light image of the other vehicle in from of and in the center of the vehicle, is required to be imaged with high resolution.

When the illumination intensity around the vehicle is detected, the image information of the image is necessitated with sufficiently wide range, i.e., wide view angle, wide dynamic range, and high sensitivity so that sufficient illumination intensity is secured. Further, preferably, the illumination intensity is detected on the basis of the image information obtained from much wider range. This is because environment around the vehicle may be changed from moment to moment. For example, the Sun light may be reflected by a window of a tall building, or a neon lighting is irradiated from a roof of a tall building. Thus, a region R10b shown as a dotted line in FIG. 3, which corresponds to the illumination intensity around the vehicle, is required to be imaged with wide view angle, wide dynamic range and high sensitivity.

When the landscape IMG is imaged by the image module, the image corresponding to the region R10a in the landscape IMG is obtained as the image IMG10a shown in FIG. 4A, and the image corresponding to the region R10b is obtained as the image IMG10b shown in FIG. 4B. In the region R10a, another vehicle C in front of and in the center of the vehicle is disposed. The outline of the other vehicle C is captured by sufficiently large number of the image elements PE1 in the upper imager 21a of the imager 20. The upper imager 21a forms an upper portion of a protruding shape of the imager 20. Thus, the other vehicle C is captured with high resolution. In the region R10b, a cloud CL and the Sun S are disposed. The outlines of the cloud CL and the Sun S are captured by the image elements PE2 in the lower imager 21b of the imager 20. The lower imager 21b forms a lower portion of a protruding shape of the imager 20. Thus, the cloud CL and the Sun S are captured with wide dynamic range, high sensitivity and wide view angle. Thus, the image module can detect both of the other vehicle around the vehicle and the illumination intensity around the vehicle. Specifically, the image module meets not only requirements for detecting the other vehicle C but also requirements for detecting the illumination intensity.

The image module according to the first embodiment has the following points.

(1) The imager 20 is divided into two parts 21a, 21b in the direction of gravitational force. The upper imager 21a is disposed on the upper side of the imager 20 in the direction of gravitational force, and the lower imager 21b is disposed on the lower side of the imager 20 in the direction of gravitational force. The upper imager 21a includes the image elements PE1, and the number of the elements PE1 per unit area is large. The lower imager 21b includes the image elements PE2, and the number of the elements PE2 per unit area is small. The elements PE1, PE2 in each imager 21a, 21b are arranged to be a square lattice pattern. Thus, both of requirements for detecting the other vehicle C and requirements for detecting the illumination intensity are satisfied. Further, two different objects can be detected by one imager 20. Thus, the manufacturing steps of the image module are reduced, and the manufacturing cost of the image module is reduced.

(2) The imager 20 has the protruding shape, which is divided into two parts 21a, 21b, one of which forms the upper portion of the protruding shape (the protruding portion) in the direction of gravitational force, and the other one of which forms the lower portion of the protruding shape (the non-protruding portion) in the direction of gravitational force. The number of the image elements PE1 in the upper imager 21a is equal to that in the lower imager 21b. Thus, the other vehicle C disposed in front of the vehicle and in the center of the vehicle among the other vehicles around the vehicle is imaged with high resolution. Further, the illumination intensity around the vehicle can be detected on the basis of the image information obtained from wide range. Thus, the characteristics of the image module are improved.

(3) The illumination intensity around the vehicle is detected on the basis of the image information of the image IMG10b, which is imaged with low resolution. Thus, the load of the image processing in the image processing circuit 22 is reduced, and therefore, the total processing performance of the image module is improved.

(4) The image processing circuit 22 for performing the image processing of the light image focused on the imager 20 is formed on the side of the upper imager 21a in the imager 20. Thus, unused portion in the imager 20 is effectively utilized. Accordingly, the dimensions of the image module are minimized.

(5) One convex lens 10 as an optical system for focusing the light image of the landscape outside the vehicle on the imager 20 is used. Thus, the number of parts of the image module is minimized. Further, the optical system in the image module is easily provided.

Second Embodiment

Figure 5A:
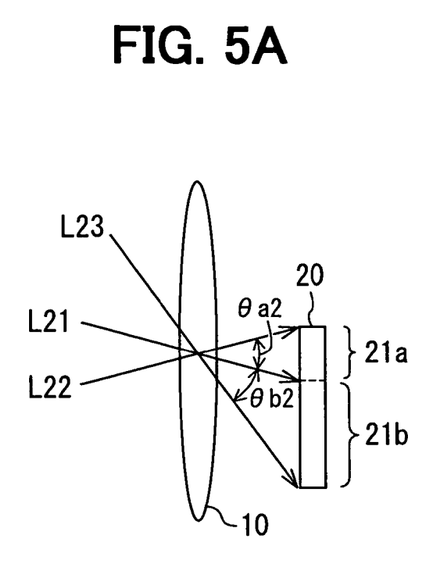
FIG. 5A is a side view showing an in-vehicle image module according to a second embodiment of the present invention.
Figure 5B:
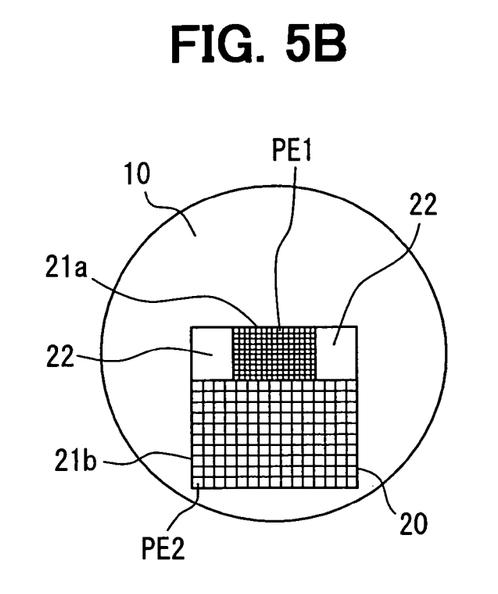
FIG. 5B is a front view showing the module shown in FIG. 5A.

An image module according to a second embodiment of the present invention is shown in FIGS. 5A and 5B. In this module, the optical center of the convex lens 10 faces the upper imager 21a of the imager 20. Thus, the convex lens 10 and the imager 20 are shifted. Thus, the optical center of the convex lens 10, at which the light is easily condensed, faces the upper imager 21a having the large number of the image elements PE1 per unit area.

In the module, when the other vehicle around the vehicle is detected, the light corresponding to the light image of the top of the other vehicle proceeds along with the light path L21, and the light reaches the bottom of the upper imager 21a in the imager 20. The light corresponding to the light image of the bottom of the other vehicle proceeds along with the light path L22, and the light reaches the top of the upper imager 21a in the imager 20. Thus, the light image corresponding to the other vehicle is focused on the upper imager 21a with a view angle of θa2. Therefore, the light passing through the center of the convex lens 10 is focused on the upper imager 21a of the imager 20. When the illumination intensity around the vehicle is detected, the light corresponding to the illumination intensity of a near side of the vehicle proceeds along with the light path L21, and the light reaches the top of the lower imager 21b in the imager 20. The light corresponding to the illumination intensity of a far side of the vehicle proceeds along with the light path L23, and the light reaches the bottom of the lower imager 21b in the imager 20. Thus, the light image corresponding to the illumination intensity around the vehicle is focused on the lower imager 21b with a view angle of θb2.

In general, the convex lens 10 has characteristics such that it is difficult to condense the light entered into the convex lens 10 as the light passes through a periphery portion of the convex lens 10. Specifically, as the periphery portion of the lens 10 moves away from the optical center of the lens 10, the collection of the light passing through the periphery becomes harder. Thus, aberration of light becomes larger, or brightness becomes lower as the periphery portion of the lens 10 moves away from the optical center. However, in the image module, since the optical center of the convex lens 10 faces the upper imager 21a having the large number of the image elements PE1 per unit area, the image information of the other vehicle around the vehicle is obtained with large contrast and high resolution.

The image module according to the second embodiment has the above described points (1) to (5). In addition, the image module has the following point.

(6) Since the optical center of the convex lens 10 faces the upper imager 21a so that the convex lens 10 and the imager 20 are shifted, the image information of the other vehicle is obtained with large contrast and high resolution. Accordingly, the image processing circuit 22 can perform image analysis with high accuracy.

Third Embodiment

Figure 6A:
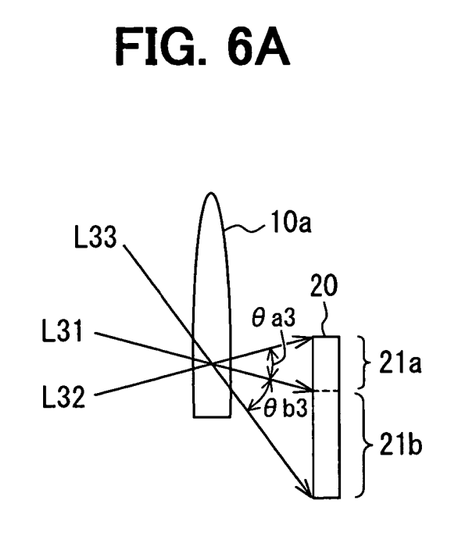
FIG. 6A is a side view showing an in-vehicle image module according to a third embodiment of the present invention.
Figure 6B:
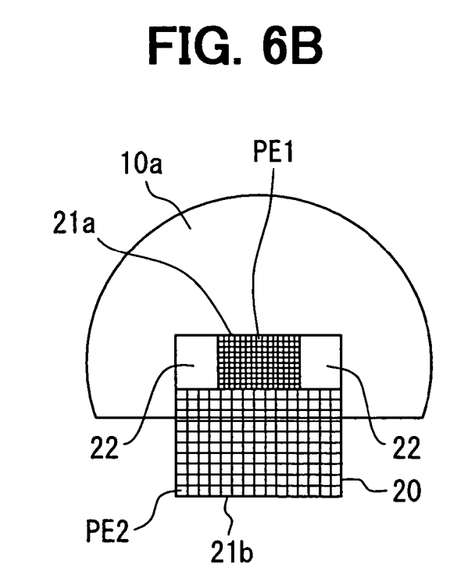
FIG. 6B is a front view showing the module shown in FIG. 6A.

An image module according to a third embodiment of the present invention is shown in FIGS. 6A and 6B. In the module, the optical center of the convex lens 10 faces the upper imager 21a so that the convex lens 10 and the imager 20 are shifted. A part of the convex lens 10a, which faces the lower image 21b of the imager 20, is removed. Thus, the optical center of the lens 10a faces the upper imager 21a having the large number of the image elements PE1 per unit area so that the image information of the image of the other vehicle around the vehicle is sufficiently obtained. Further, the image information of the image for detecting the illumination intensity around the vehicle is also obtained sufficiently. Since the part of the lens 10a is removed, the dimensions of the module are minimized.

In the module, when the other vehicle around the vehicle is detected, the light corresponding to the light image of the top of the other vehicle proceeds along with the light path L31, and the light reaches the bottom of the upper imager 21a in the imager 20. The light corresponding to the light image of the bottom of the other vehicle proceeds along with the light path L32, and the light reaches the top of the upper imager 21a in the imager 20. Thus, the light image corresponding to the other vehicle is focused on the upper imager 21a with a view angle of θa3. Therefore, the light passing through the center of the convex lens 10 is focused on the upper imager 21a of the imager 20. Here, the light passing through the center of the lens 10a is easily condensed. When the illumination intensity around the vehicle is detected, the light corresponding to the illumination intensity of a near side of the vehicle proceeds along with the light path L31, and the light reaches the top of the lower imager 21b in the imager 20. The light corresponding to the illumination intensity of a far side of the vehicle proceeds along with the light path L33, and the light reaches the bottom of the lower imager 21b in the imager 20. Thus, the light image corresponding to the illumination intensity around the vehicle is focused on the lower imager 21b with a view angle of θb3.

In the above module, since the optical center of the lens 10a, through which the light is easily condensed, faces the upper imager 21a having the large number of the image elements PE1 per unit area, the image information of the other vehicle can be obtained with large contrast and high resolution.

Further, although the part of the lens 10a, which faces the lower imager 21b, is removed, the image information for detecting the other vehicle and the illumination intensity is sufficiently obtained. Furthermore, the dimensions of the module are minimized.

The image module according to the third embodiment has the above described points (1) to (6). In addition, the image module has the following point.

(7) Although the part of the lens 10a is removed, the image information for detecting the other vehicle and the illumination intensity is sufficiently obtained, and the dimensions of the module are minimized.

(Modifications)

Although the module includes one convex lens, the module may include another optical system. For example, the module may include multiple lenses. In this case, lens aberration of the optical system in the module is easily reduced. Here, the lens aberration is caused by the lens, the center of which is easily condensed, compared with the periphery of the lens.

Although the module includes the image processing circuit 22 disposed on the side of the upper imager 21a, the module may include another circuit. For example, the module may include a circuit for determining information about a type of the other vehicle and a distance between the vehicle and the other vehicle in front of the vehicle on the basis of image analysis of the image. Alternatively, the module may include the above circuit for determining the information in addition to the image processing circuit 22. Thus, the unused portion in the imager 20 is effectively utilized, so that the dimensions of the image module are minimized. Further, although the image processing circuit 22 is disposed on the side of the upper imager 21a so that the circuit 22 is disposed in the imager 20, the circuit may not be disposed in the imager 20.

In the module, the imager 20 having multiple image elements PE arranged to be a square lattice is divided into the upper imager 21a disposed on the upper portion of the protruding shape of the imager 20 and the lower imager 21b disposed on the lower portion of the protruding shape. Further, the number of the image elements PE1 in the upper imager 21a is equal to that in the lower imager 21b. Alternatively, when two conditions, one of which is such that the number of the image elements PE1 per unit area in the upper imager 21a is larger than that in the lower imager 21b, and the other one of which is such that the image elements PE1, PE2 in the upper and the lower imagers 21a, 21b are arranged to be a square shape, are satisfied, the image module has at least the above described point (1), even if the number of the image elements PE1 in the upper imager 21a is smaller than that in the lower imager 21b. Alternatively, when the number of the image elements PE1 in the upper imager 21a is equal to or larger than that in the lower imager 21b, the resolution of the upper imager 21a for capturing the light image of the other vehicle in front of and in the center of the vehicle is sufficiently secured. Accordingly, the resolution of the upper imager 21a is much improved.

Although the imager 20 has the protruding shape in the direction of gravitational force, the imager 20 may have another shape. For example, the imager 20 may be divided into three parts or more. In this case, when the number of the image elements per unit area in a part of the imager 20 disposed on an upper portion of the imager 20 becomes larger than that on a lower portion of the imager 20, at least the above described point (1) is obtained.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. An in-vehicle image module for imaging a light image of an outside of an automotive vehicle, the module comprising:
   an imager having multiple image elements, which are disposed to be a square lattice pattern;
   an optical system for focusing the light image on the imager; and
   an image processing circuit for processing the light image focused on the imager, wherein
   the imager includes an upper imager and a lower imager in a direction of gravitational force,
   the imager has a protruding shape wherein a lateral width of the upper imager is less than a lateral width of the lower imager,
   the upper imager is disposed on an upper side of the protruding shape of the imager in the direction of gravitational force,
   the lower imager is disposed on a lower side of the protruding shape of the imager in the direction of gravitational force,
   the upper imager has a number of the image elements per unit area, which is larger than a number of the image elements per unit area in the lower imager, and
   the image processing circuit is disposed on a side of the upper imager.

2. The module according to claim 1, wherein
   the upper imager has a number of the image elements, which is equal to or larger than a number of the image elements in the lower imager.

3. The module according to claim 2, wherein
   an area of the upper imager is smaller than an area of the lower imager so that each image element in the upper imager is smaller than that in the lower imager.

4. The module according to claim 3, wherein
   the image elements in the upper imager are arranged to be a square lattice pattern, and
   the image elements in the lower imager are arranged to be a square lattice pattern.

5. The module according to claim 1, wherein
   the optical system includes a convex lens.

6. The module according to claim 5, wherein
   the convex lens has an optical center facing the upper imager so that the convex lens and the imager are shifted in the direction of gravitational force.

7. The module according to claim 6, wherein
   the convex lens has a shape, a part of which is missing, and the missing part of the shape of the convex lens faces the lower imager.

8. The module according to claim 1, wherein a longitudinal length of the upper imager is less than a longitudinal length of the lower imager.

9. The module according to claim 1, wherein the upper imager provides a small view angle and the lower imager provides a wide view angle substantially wider than the small view angle.

10. An in-vehicle image module for imaging a light image of an outside of an automotive vehicle, the module comprising:
    an imager having multiple image elements, which are disposed to be a square lattice pattern;
    an optical system for focusing the light image on the imager; and
    an image processing circuit for processing the light image focused on the imager, wherein
    the imager includes a plurality of parts in a direction of gravitational force, a part of the imager, which is disposed on an upper side of the imager in the direction of gravitational force, has a number of the image elements per unit area larger than a number of the image elements per unit area in another part of the imager, which is disposed on a lower side of the imager in the direction of gravitational force, and the optical system includes a convex lens, wherein the imager includes an upper imager and a lower imager in the direction of gravitational force, the imager has a protruding shape wherein a lateral width of the upper imager is less than a lateral width of the lower imager, the upper imager is disposed on an upper side of the protruding shape of the imager in the direction of gravitational force, the lower imager is disposed on a lower side of the protruding shape of the imager in the direction of gravitational force, and the image processing circuit is disposed on a side of the upper imager.

11. The module according to claim 10, wherein
the upper imager has a number of the image elements, which is equal to or larger than a number of the image elements in the lower imager.

12. The module according to claim 11, wherein
an area of the upper imager is smaller than an area of the lower imager so that each image element in the upper imager is smaller than that in the lower imager.

13. The module according to claim 12, wherein
the image elements in the upper imager are arranged to be a square lattice pattern, and
the image elements in the lower imager are arranged to be a square lattice pattern.

14. The module according to claim 10, wherein
the convex lens has an optical center facing the upper imager so that the convex lens and the imager are shifted in the direction of gravitational force.

15. The module according to claim 14, wherein
the convex lens has a shape, a part of which is missing, and
the missing part of the shape of the convex lens faces the lower imager.

16. The module according to claim 10, wherein a longitudinal length of the upper imager is less than a longitudinal length of the lower imager.

17. The module according to claim 10, wherein the upper imager provides a small view angle and the lower imager provides a wide angle substantially wider than the small view angle.

18. An in-vehicle image module for imaging an external partial periphery of an automotive vehicle, the module comprising:
an imager having multiple image elements, which are disposed to be a square lattice pattern;
an optical system for focusing a light image of the external partial periphery on the imager; and
an image processing circuit for processing the light image focused on the imager, wherein
the imager includes an upper imager and a lower imager, a lateral width and longitudinal length of the upper imager being substantially less than a lateral width and longitudinal length of the lower imager, and
the image processing circuit is disposed on a side of the upper imager.

19. The module according to claim 18, wherein the upper imager has a number of the image elements which is substantially equal to a number of the image elements in the lower imager.

20. The module according to claim 18, wherein the upper imager provides a small view angle and the lower imager provides a wide view angle substantially wider than the small view angle.

* * * * *